(12) United States Patent
Jacobs et al.

(10) Patent No.: US 9,891,541 B2
(45) Date of Patent: Feb. 13, 2018

(54) THERMAL CONDITIONING UNIT, LITHOGRAPHIC APPARATUS AND DEVICE MANUFACTURING METHOD

(71) Applicant: ASML Netherlands B.V., Veldhoven (NL)

(72) Inventors: Johannes Henricus Wilhelmus Jacobs, Heeze (NL); Jan Steven Christiaan Westerlaken, Heesch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/395,461

(22) PCT Filed: Apr. 16, 2013

(86) PCT No.: PCT/EP2013/057867
§ 371 (c)(1),
(2) Date: Oct. 17, 2014

(87) PCT Pub. No.: WO2013/171013
PCT Pub. Date: Nov. 21, 2013

(65) Prior Publication Data
US 2015/0070666 A1    Mar. 12, 2015

Related U.S. Application Data

(60) Provisional application No. 61/737,002, filed on Dec. 13, 2012, provisional application No. 61/648,452, filed on May 17, 2012.

(51) Int. Cl.
*G03B 27/52* (2006.01)
*G03B 27/58* (2006.01)
(Continued)

(52) U.S. Cl.
CPC .......... *G03F 7/70875* (2013.01); *G03F 7/707* (2013.01); *G03F 7/7095* (2013.01);
(Continued)

(58) Field of Classification Search
CPC .......... H01L 21/67103; G03F 7/70783; G03F 7/70875; G03F 7/70716; G03F 7/707; G03F 7/70891; G03F 7/7095
(Continued)

(56) References Cited

U.S. PATENT DOCUMENTS 4,874,273 A * 10/1989 Tokisue ............ H01L 21/67784
406/19
6,471,913 B1 * 10/2002 Weaver ............. H01L 21/67103
118/725
(Continued)

FOREIGN PATENT DOCUMENTS

CN    1804725    7/2006
CN    102375347    3/2012
(Continued)

OTHER PUBLICATIONS

English translation of JP 2000-323406, published on Nov. 24, 2000.*
(Continued)

*Primary Examiner* — Christina Riddle
(74) *Attorney, Agent, or Firm* — Pillsbury Winthrop Shaw Pittman, LLP

(57) ABSTRACT

A thermal conditioning unit to thermally condition a substrate, the thermal conditioning unit including: a thermal conditioning element having a first layer, in use, facing the substrate and including a material having a thermal conductivity of 100 W/mK or more, a second layer and a heat transfer component positioned between the first and second layers; and a stiffening member which is stiffer than the
(Continued)

thermal conditioning element and configured to support the thermal conditioning element so as to reduce mechanical deformation thereof, wherein the thermal conditioning element is thermally isolated from the stiffening member.

20 Claims, 11 Drawing Sheets

(51) Int. Cl.
 *G03F 7/20* (2006.01)
 *H01L 21/67* (2006.01)
(52) U.S. Cl.
 CPC ...... *G03F 7/70716* (2013.01); *G03F 7/70783* (2013.01); *G03F 7/70891* (2013.01); *H01L 21/67103* (2013.01)
(58) Field of Classification Search
 USPC ............ 355/30, 52, 53, 55, 72–77; 206/710; 250/492.1, 492.2, 492.22, 493.1, 548
 See application file for complete search history.

(56) References Cited

U.S. PATENT DOCUMENTS

| | | | | |
|---|---|---|---|---|
| 6,847,014 | B1* | 1/2005 | Benjamin | ......... H01L 21/67248 219/444.1 |
| 7,071,551 | B2* | 7/2006 | Hiramatsu | ........ H01L 21/67103 257/690 |
| 7,106,416 | B2 | 9/2006 | Box et al. | |
| 7,532,310 | B2 | 5/2009 | Mertens et al. | |
| 7,649,611 | B2 | 1/2010 | Zaal et al. | |
| 8,988,650 | B2 | 3/2015 | Westerlaken et al. | |
| 2002/0017916 | A1* | 2/2002 | Costello | ............ H01L 21/67109 324/750.09 |
| 2004/0036850 | A1* | 2/2004 | Tsukamoto | ............. G03F 7/707 355/72 |
| 2004/0207824 | A1 | 10/2004 | Lof et al. | |
| 2005/0128448 | A1 | 6/2005 | Box et al. | |
| 2005/0146694 | A1* | 7/2005 | Tokita | .................... G03B 27/52 355/30 |
| 2006/0038968 | A1 | 2/2006 | Kemper et al. | |
| 2006/0102849 | A1 | 5/2006 | Mertens et al. | |
| 2006/0158627 | A1 | 7/2006 | Kemper et al. | |
| 2007/0023320 | A1 | 2/2007 | Itakura et al. | |
| 2007/0070315 | A1* | 3/2007 | Jacobs | ................ G03F 7/70341 355/53 |
| 2007/0153244 | A1 | 7/2007 | Zaal et al. | |
| 2008/0212046 | A1 | 9/2008 | Riepen et al. | |
| 2009/0086435 | A1* | 4/2009 | Suzuki | ................ H01L 23/3735 361/704 |
| 2009/0279060 | A1 | 11/2009 | Direcks et al. | |
| 2009/0279062 | A1 | 11/2009 | Direcks et al. | |
| 2010/0313974 | A1 | 12/2010 | Riepen et al. | |
| 2011/0222033 | A1 | 9/2011 | Ten Kate et al. | |
| 2012/0013865 | A1 | 1/2012 | Laurent et al. | |
| 2012/0052447 | A1 | 3/2012 | Westerlaken et al. | |
| 2012/0120376 | A1 | 5/2012 | Bessems et al. | |
| 2013/0038854 | A1 | 2/2013 | Kunnen et al. | |

FOREIGN PATENT DOCUMENTS

| | | |
|---|---|---|
| EP | 1 420 298 | 5/2004 |
| EP | 2 423 749 | 2/2012 |
| JP | H03-154324 | 7/1991 |
| JP | H04-303913 | 10/1992 |
| JP | 2000323406 A * | 11/2000 |
| JP | 2000-349005 | 12/2000 |
| JP | 2002-252270 | 9/2002 |
| JP | 2004-103799 | 4/2004 |
| JP | 2005-175490 | 6/2005 |
| JP | 2005-235672 | 9/2005 |
| JP | 2007-035706 | 2/2007 |
| JP | 2007-035737 | 2/2007 |
| JP | 2007-142238 | 6/2007 |
| JP | 2007-194618 | 8/2007 |
| JP | 2012-032805 | 2/2012 |
| TW | 200721363 | 6/2007 |
| WO | 97/14077 | 4/1997 |
| WO | 99/49504 | 9/1999 |

OTHER PUBLICATIONS

International Search Report dated Jul. 18, 2013 in corresponding International Patent Application No. PCT/EP2013/057867.
Japanese Office Action dated Mar. 15, 2017 in corresponding Japanese Patent Application No. 2016-114394.

* cited by examiner

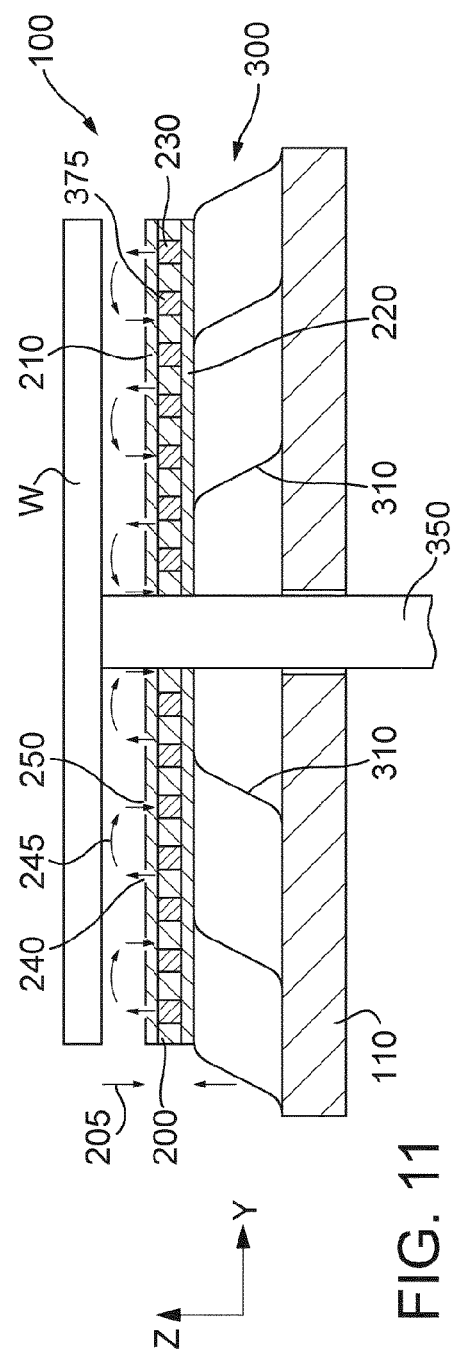
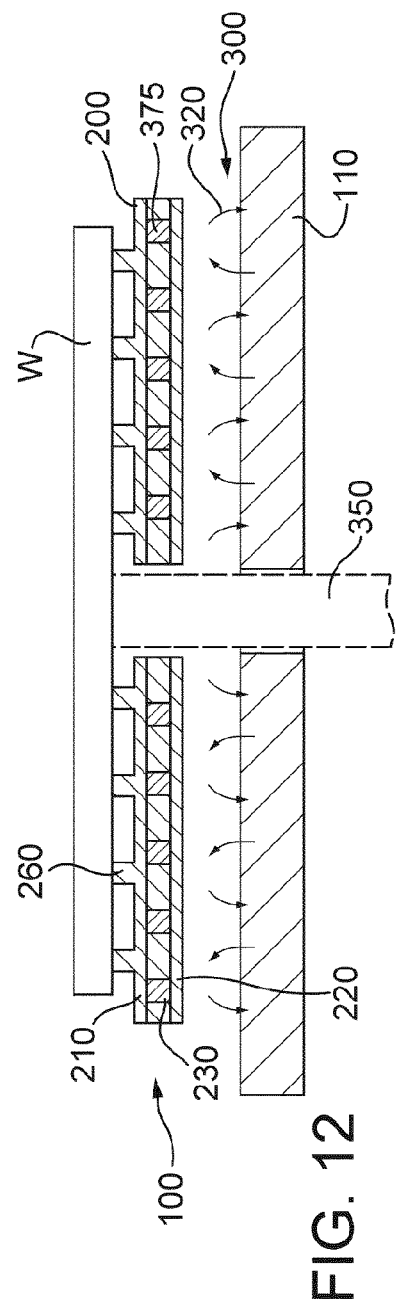
FIG. 11
FIG. 12

THERMAL CONDITIONING UNIT, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2013/057867, which was filed on Apr. 16, 2013, which claims the benefit of priority of U.S. provisional application No. 61/648,452, which was filed on May 17, 2012, and U.S. provisional application No. 61/737,002, which was filed on Dec. 13, 2012, each of which is incorporated herein in its entirety by reference.

FIELD

The present invention relates to a thermal conditioning unit, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

SUMMARY

Before being positioned on a substrate table in a lithographic apparatus ready for exposure or other operation, a substrate is generally temperature conditioned. The aim is to place the substrate on the substrate table only when its temperature is within a desired temperature level and/or uniformity. If the temperature is not within the desired temperature level and/or uniformity, this can lead to imaging errors (for example overlay errors) and/or other difficulties. Additionally, if the desired temperature level and/or uniformity has not been achieved this can lead to thermal instability in the system.

A process substrate is delivered by a track where it is usually temperature conditioned on a chill plate before being loaded onto a temperature stabilization unit which may be part of the track, a substrate handler and/or the lithographic apparatus. At the temperature stabilization unit the substrate is conditioned to have the desired temperature level and/or uniformity. Additionally pre-alignment of the substrate may take place. Thereafter the substrate is loaded onto the substrate table by the substrate handler in the lithographic apparatus.

A dummy substrate may be loaded onto a substrate table in the lithographic apparatus. For example, a dummy substrate may be used during pre-conditioning of the substrate table and/or during a calibration process. The purpose of the dummy substrate is that it takes the place of a normal substrate so that the machine behaves normally as if a substrate were on the substrate table. A dummy substrate may not be delivered via the track and may not be conditioned on a chill plate. A dummy substrate may be stored in a holding location in the apparatus. Therefore, a dummy substrate may be loaded directly onto the temperature stabilization unit. A dummy substrate may therefore have a larger temperature off-set from the desired temperature level and/or uniformity it is first placed on the temperature stabilization unit than a process substrate.

A lithographic apparatus may allow a substrate to be loaded from a source other than a track or a holding location in the apparatus and such a substrate is typically not conditioned on a chill plate but is loaded directly onto the temperature stabilization unit. Such a substrate may also vary from the desired temperature level and/or uniformity more than a process substrate from the track.

A difficulty is that a dummy substrate and/or a substrate not loaded from the track may require a longer residence time on the temperature stabilization unit in order to achieve the desired temperature level and/or uniformity. This leads to a loss in throughput because of the longer waiting time of the substrate on the temperature stabilization unit. Additionally, the temperature of the temperature stabilization unit itself may not recover quickly enough before the first process substrate from the track is placed on the temperature stabilization unit after a dummy substrate or a substrate which has not been processed along the track. This can lead to an increased temperature off-set of both the temperature stabilization unit and the substrate temperature for the first few process substrate after the dummy substrate or substrate not loaded from the track. The increased temperature off-set may lead to an overlay error on the process substrate.

Additionally, the temperature recovery time of a temperature stabilization unit is desirably as low as possible to increase throughput of substrates through the apparatus.

It is desirable, for example, to provide a thermal conditioning unit which can quickly condition the temperature level and/or uniformity of a substrate and/or recover temperature level and/or uniformity itself quickly between substrates.

According to an aspect of the invention, there is provided a thermal conditioning unit to thermally condition a substrate in a lithographic apparatus, the thermal conditioning unit comprising: a thermal conditioning element comprising a first layer, in use, facing the substrate and comprising a material having a thermal conductivity of 100 W/mK or more, a second layer and a heat transfer component positioned between the first and second layers; and a stiffening member which is stiffer than the thermal conditioning element and configured to support the thermal conditioning element so as to reduce mechanical deformation thereof, wherein the thermal conditioning element is thermally isolated from the stiffening member.

According to an aspect of the present invention, there is provided a device manufacturing method using a lithographic apparatus, the method comprising: thermally conditioning a substrate by placing it over a thermal conditioning element comprising a first layer, facing the substrate, comprising a material having a thermal conductivity of 100 W/mK or more, a second layer and a heat transfer component positioned between the first and second layers, the thermal conditioning element being supported by a stiffening member to reduce mechanical deformation of the thermal conditioning element; and projecting a patterned beam onto the substrate, wherein the thermal conditioning element is thermally isolated from the stiffening member.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 11 illustrates, in cross-section, a thermal conditioning unit according to an embodiment of the present invention;

FIG. 12 illustrates, in cross-section, a thermal conditioning unit according to an embodiment of the present invention;

DETAILED DESCRIPTION

Figure 1:
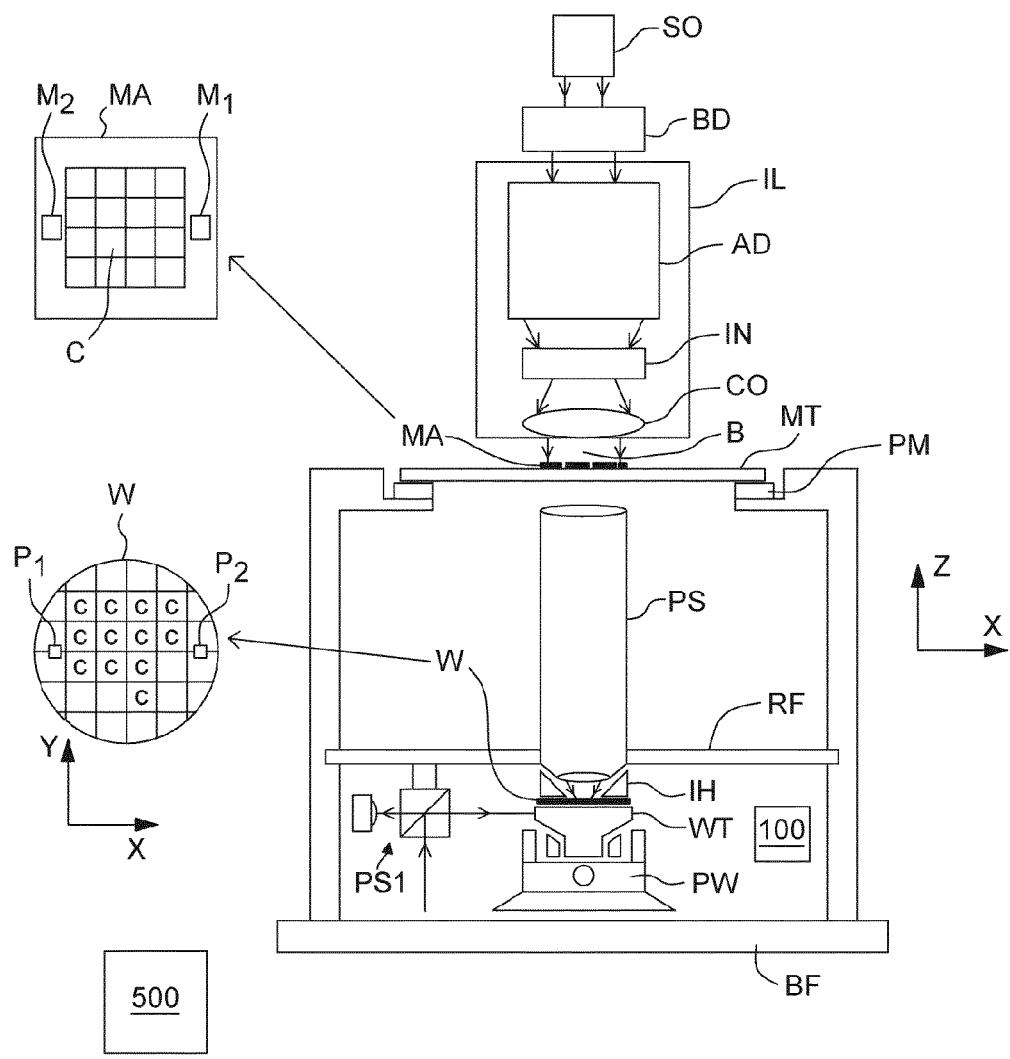
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "projection system" used herein should be broadly interpreted as encompassing any type of system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least part one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. Substrate W is held on the substrate table WT by a substrate holder according to an embodiment of the present invention and described further below. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the volume filled with liquid remains substantially stationary relative to the projection system PS while the substrate W moves underneath that volume. FIGS. 2-5 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
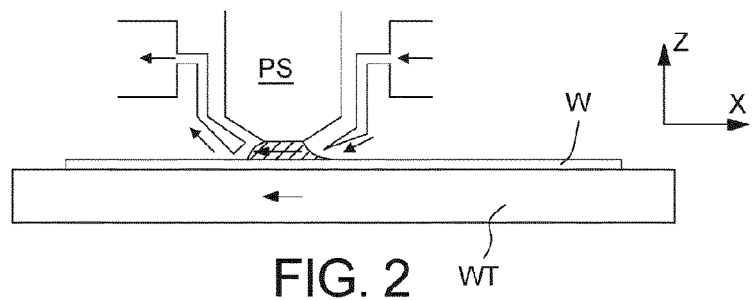
FIGS. 2 and 3 depict a liquid supply system for use in a lithographic projection apparatus.
Figure 3:
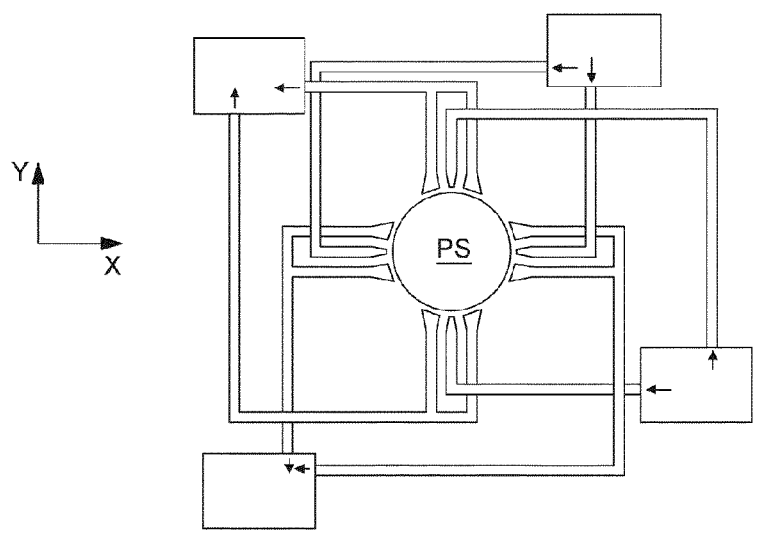

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. Various orientations and numbers of in- and outlets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
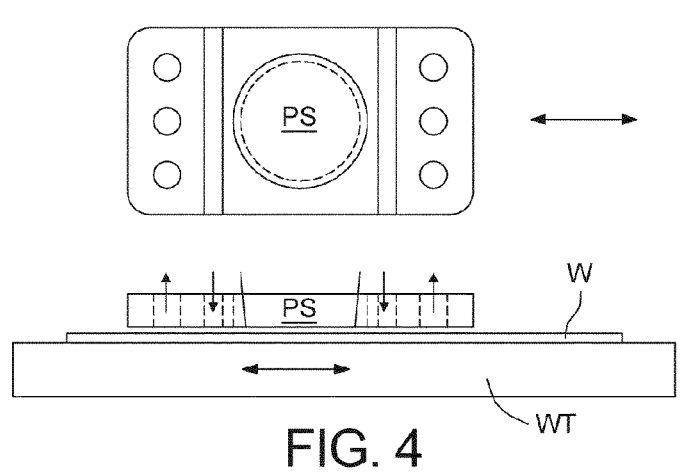
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate, substrate table or both. Such an arrangement is illustrated in FIG. 5.

Figure 5:
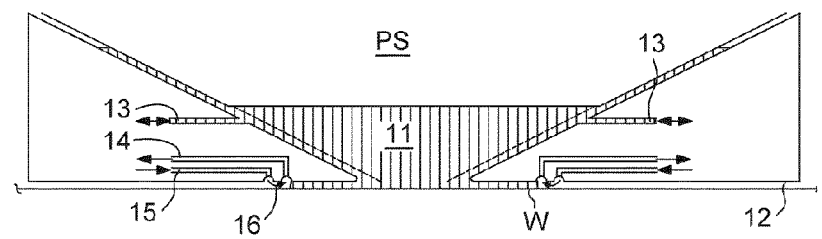
FIG. 5 depicts, in cross-section, a barrier member which may be used in an embodiment of the present invention as an immersion liquid supply system.

FIG. 5 schematically depicts a localized liquid supply system or fluid handling system with a liquid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) In an embodiment, a seal is formed between the liquid confinement structure 12 and the surface of the substrate W and which may be a contactless seal such as a gas seal (such a system with a gas seal is disclosed in European patent application publication no. EP-A-1,420, 298) or a liquid seal.

The liquid confinement structure 12 at least partly contains liquid in the space 11 between a final element of the projection system PS and the substrate W. The space 11 is at least partly formed by the liquid confinement structure 12 positioned below and surrounding the final element of the projection system PS. Liquid is brought into the space below the projection system PS and within the liquid confinement structure 12 by liquid inlet 13. The liquid may be removed by liquid outlet 13.

The liquid may be contained in the space 11 by a gas seal 16 which, during use, is formed between the bottom of the barrier member 12 and the surface of the substrate W. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. Such a system is disclosed in United States patent application publication no. US 2004-0207824, which is hereby incorporated by reference in its entirety. In an embodiment, the liquid confinement structure 12 does not have a gas seal.

An embodiment of the present invention may be applied to any fluid handling structure including those disclosed, for example, in United States patent application publication nos. US 2006-0158627, US 2006-0038968, US 2008-0212046, US 2009-0279060, US 2009-0279062, US 2004-0207824, US 2010-0313974 and US 2012-0120376, the contents of all of which are hereby incorporated in their entirety by reference.

Many other types of liquid supply system are possible. An embodiment of the present invention is neither limited to any particular type of liquid supply system, nor to immersion lithography. An embodiment of the invention may be applied equally in any lithography. In an EUV lithography apparatus, the beam path is substantially evacuated and immersion arrangements described above are not used.

A control system 500 shown in FIG. 1 controls the overall operations of the lithographic apparatus and in particular performs an optimization process described further below. Control system 500 can be embodied as a suitably-programmed general purpose computer comprising a central processing unit and volatile and non-volatile storage. Optionally, the control system may further comprise one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 6:
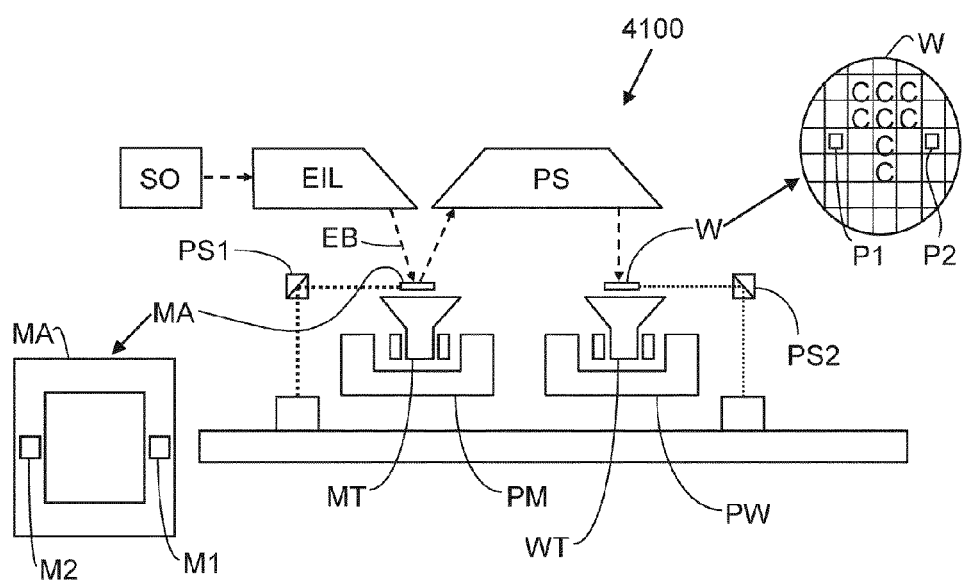
FIG. 6 depicts a lithographic apparatus according to an embodiment of the invention.

FIG. 6 schematically depicts an EUV lithographic apparatus 4100 including a source collector apparatus SO. The apparatus comprises:

an illumination system (illuminator) EIL configured to condition a radiation beam B (e.g. EUV radiation);

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

These basic components of the EUV lithographic apparatus are similar in function to the corresponding components of the lithographic apparatus of FIG. 1. The description below mainly covers areas of difference and duplicative description of aspects of the components that are the same is omitted.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

Referring to FIG. 6, the EUV illuminator EIL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range.

The radiation beam EB is incident on the patterning device (e.g., mask) MA, which is held on the support structure (e.g., mask table) MT, and is patterned by the patterning device. After being reflected from the patterning device (e.g., mask) MA, the radiation beam EB passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam EB. Similarly, the first positioner PM and another position sensor PS1 can be used to accurately position the patterning device (e.g. mask) MA with respect to the path of the radiation beam EB. Patterning device (e.g. mask) MA and substrate W may be aligned using mask alignment marks M1, M2 and substrate alignment marks P1, P2.

The depicted apparatus could be used the same modes as the apparatus of FIG. 1.

Figure 7:
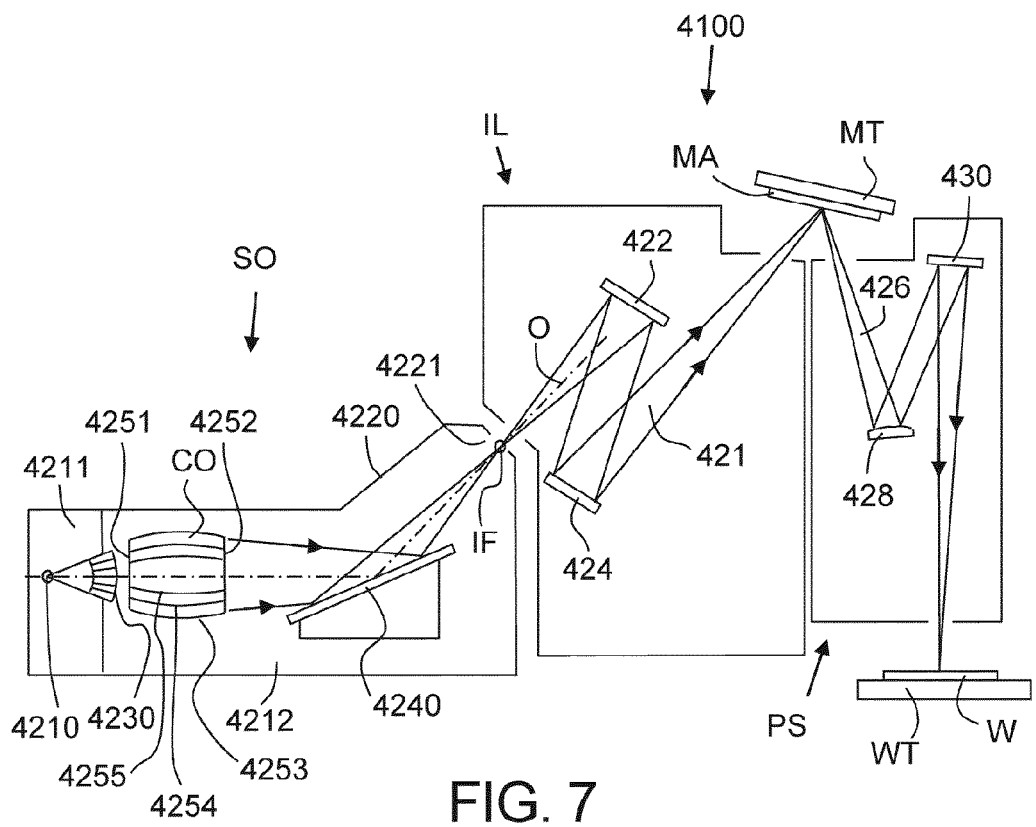
FIG. 7 is a more detailed view of the apparatus 4100.

FIG. 7 shows the EUV apparatus 4100 in more detail, including the source collector apparatus SO, the EUV illumination system EIL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the plasma 4210 is created to emit radiation in the EUV range of the electromagnetic spectrum.

The radiation emitted by the plasma 4210 is passed from a source chamber 4211 into a collector chamber 4212 via an optional gas barrier and/or contaminant trap 4230 (in some cases also referred to as contaminant barrier or foil trap) which is positioned in or behind an opening in source chamber 4211.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected by a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system IL, which may include a facetted field mirror device 422 and a facetted pupil mirror device 424 arranged to provide a desired angular distribution of the radiation beam 421, at the patterning device MA, as well as a desired uniformity of radiation intensity at the patterning device MA. Upon reflection of the beam of radiation 421 at the patterning device MA, held by the support structure MT, a patterned beam 426 is formed and the patterned beam 426 is imaged by the projection system PS via reflective elements 428, 430 onto a substrate W held by the substrate stage or substrate table WT.

Collector optic CO, as illustrated in FIG. 7, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is preferably used in combination with a discharge produced plasma source, often called a DPP source.

Figure 8:
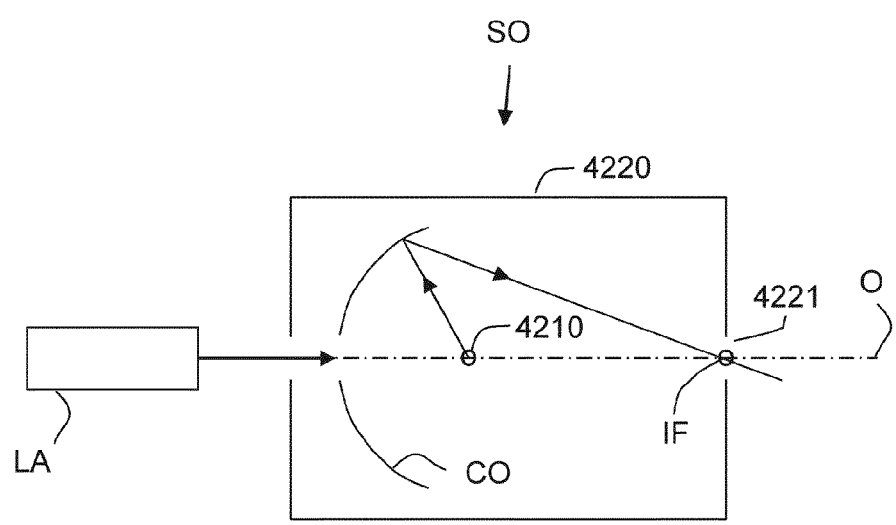
FIG. 8 is a more detailed view of the source collector apparatus SO of the apparatus of FIGS. 6 and 7.

Alternatively, the source collector apparatus SO may be part of an LPP radiation system as shown in FIG. 8. A laser LA is arranged to deposit laser energy into a fuel, such as xenon (Xe), tin (Sn) or lithium (Li), creating the highly ionized plasma 4210 with electron temperatures of several 10's of eV. The energetic radiation generated during deexcitation and recombination of these ions is emitted from the plasma, collected by a near normal incidence collector optic CO and focused onto the opening 4221 in the enclosing structure 4220.

An embodiment of the present invention can be applied to any type of lithographic apparatus.

Figure 9:
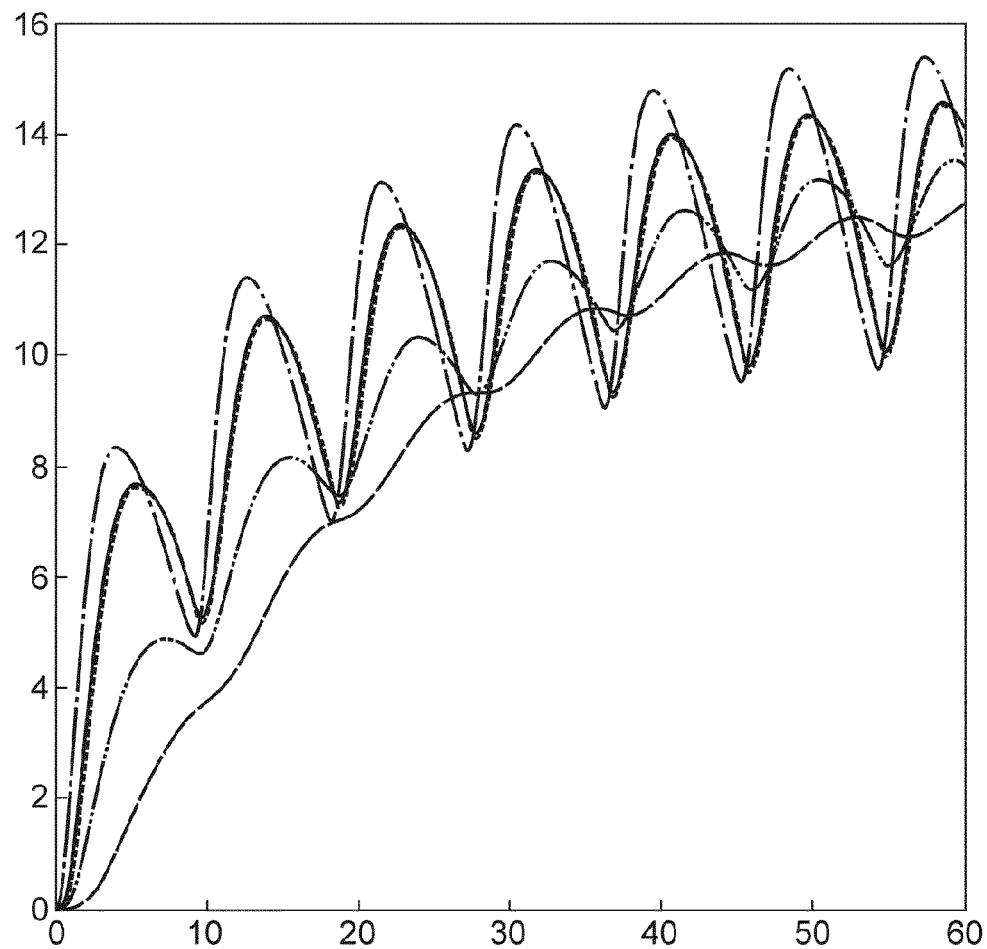
FIG. 9 is a graph of temperature on the y axis versus time on the x axis for a plurality of positions on a temperature stabilization unit.

A temperature stabilization unit comprises a thermal conditioning unit which includes a stiffening member and a thermal conditioning element to thermally condition the substrate and to support the substrate. Simulations were carried out for a thermal conditioning element (20 mm thick and of aluminum, assuming a heat transfer rate of 700 W/m$^2$ K). FIG. 9 shows temperature variation along the y axis occurring over time on the x axis for a thermal conditioning element. The temperature off-set from the starting temperature for a plurality of different locations and for thermal conditioning fluid (water) used in the thermal conditioning element is plotted. A number of substrates are placed on the thermal conditioning element at a temperature above the original temperature of the thermal conditioning unit. Substrates are placed on the thermal conditioning element approximately every nine seconds and left on the thermal conditioning element for six seconds. It can be seen that over time the temperature of the thermal conditioning element rises even though the thermal conditioning element has three seconds between substrates to recover. As a result, the temperature at which a substrate leaves the thermal conditioning element changes over time (for the top of the substrate (long dashes separated by single dots) the first substrate leaves with a temperature off-set of about 8, the second with a temperature off-set of about 11, the third with a temperature off-set of about 12, the fourth with a temperature off-set of about 13 and the fifth with a temperature off-set of about 14). This variation in temperature off-set is disadvantageous because it means that when such a substrate is positioned onto the substrate table of the lithographic apparatus, it does so at a different temperature than another substrate which can result in errors, as described above.

Figure 17:
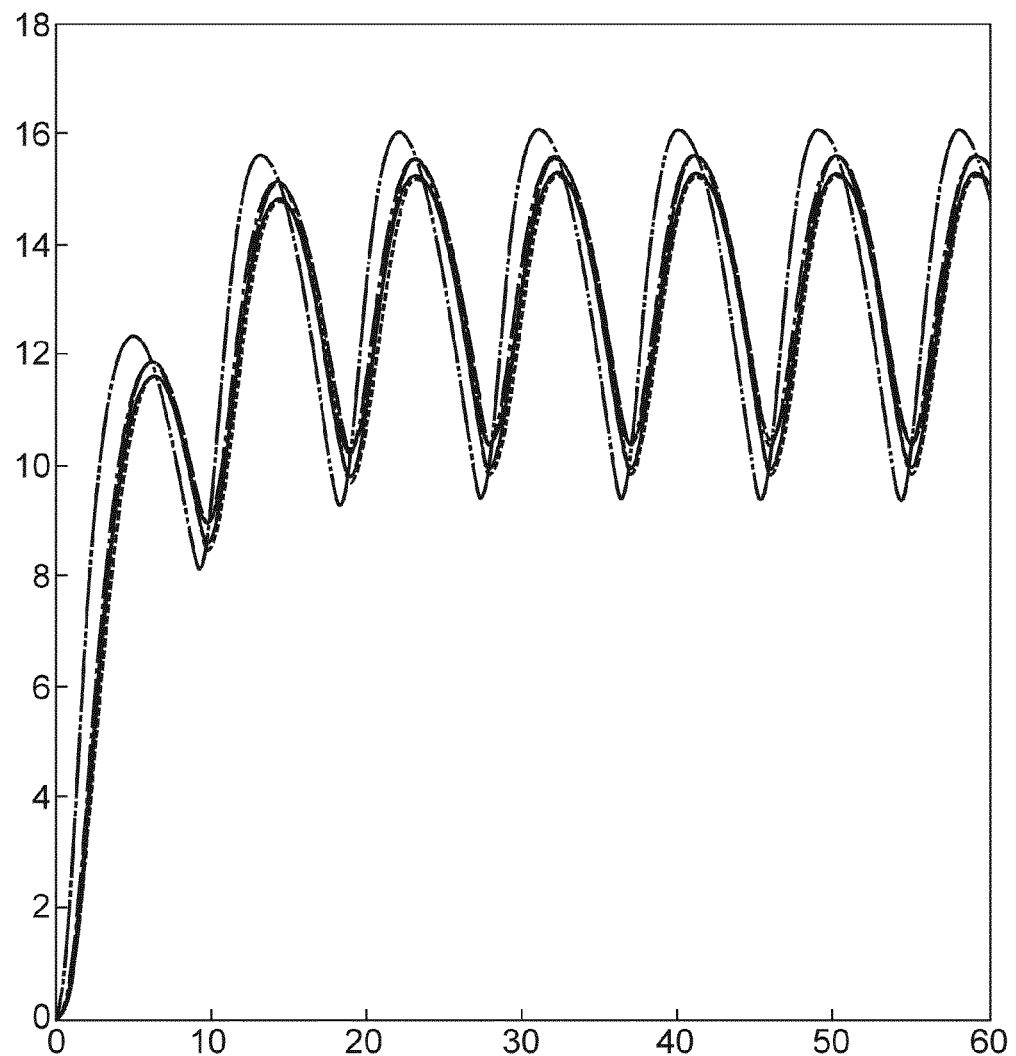
FIG. 17 is the same graph as FIG. 9 except for a thermal conditioning unit according to an embodiment of the present invention.

This difficulty results from the high heat capacity of the thermal conditioning element of the thermal conditioning unit. In a typical thermal conditioning unit, the thermal conditioning element typically has a thickness of about 20 mm and is made from aluminum. A heat transfer rate through such a thermal conditioning element (using thermally conditioned fluid passing through channels in the thermal conditioning element) of 700 W/m$^2$ K is assumed for producing the results of FIG. 9. An embodiment of the present invention as described below, assuming the same heat transfer rate, can result in the second and subsequent substrates leaving the thermal conditioning element at substantially the same temperature (as illustrated in FIG. 17 which is the result of the same simulation as FIG. 9 except with a thermal conditioning unit of an embodiment of the present invention).

Figure 10:
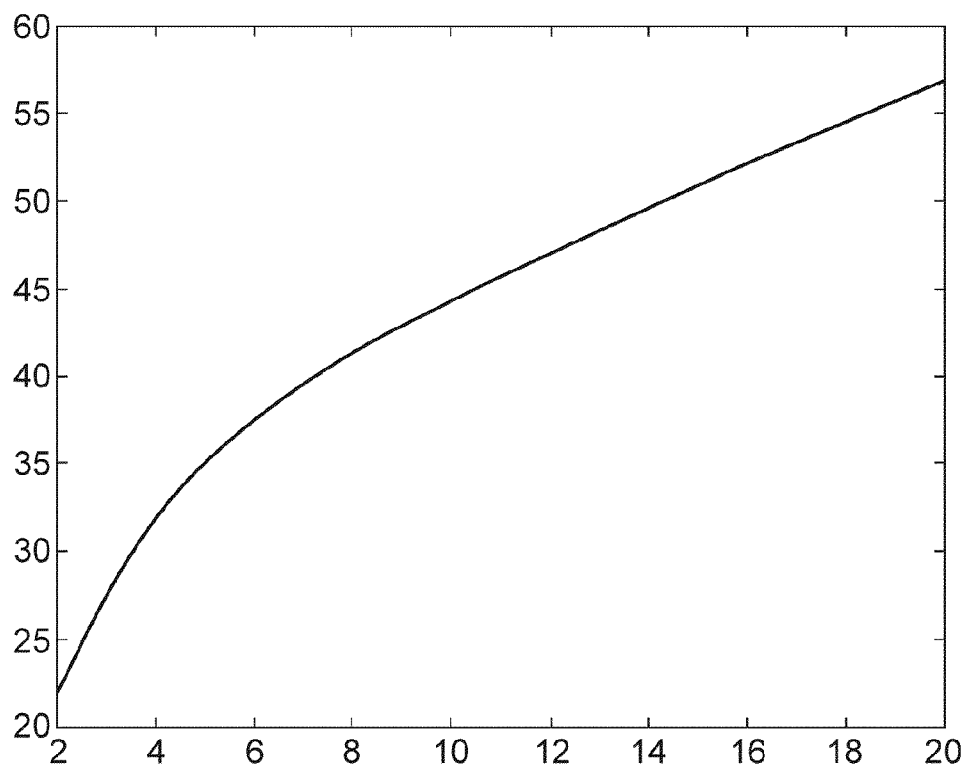
FIG. 10 is a graph of temperature off-set of a substrate on the y axis versus layer thickness on the x axis.

FIG. 10 shows the results of a simulation in which an aluminum layer is between a substrate and a thermal conditioning element and a heat transfer rate of 500 W/m$^2$K to the thermal conditioning element is assumed. The substrate is assumed to have an initial temperature off-set of 0.5 K from a desired set point. In the simulated results the aluminum layer thickness is varied (along the x axis) and the temperature off-set from the desired set point of the substrate after 6 seconds is plotted in mK on the y axis. As can be seen, the temperature off-set after 6 seconds decreases with decreasing thickness of aluminum layer.

The thermal capacity of the thermal conditioning element may be advantageously reduced by reducing its thickness as shown by FIG. 10. However, this can result in deformation of the thermal conditioning element. Such deformation results in uneven heat transfer between the thermal conditioning element and the substrate (which is supported by the thermal conditioning element). Therefore, a separate support structure for the thermal conditioning element is used to reduce mechanical deformation of the thermal conditioning element. Embodiments of the present invention decouple the mechanical support function of the thermal conditioning unit from the thermal conditioning function. That is, the mechanical support and thermal conditioning functions are separated. The thermal conditioning element supports the substrate. However, the thermal conditioning element itself might not have enough stiffness to be able to do so. This is because the thermal conditioning element is reduced in thickness to reduce the heat capacity. Therefore a support is used to support the thermal conditioning element. In an embodiment the thermal conditioning element does not have enough stiffness to support the substrate, but the stiffness is provided directly or indirectly by a stiffening member provided under the thermal conditioning element.

In an embodiment a stiffening member is provided. The stiffening member is stiffer than the thermal conditioning element and configured to support the thermal conditioning element (for example via a support). This reduces mechanical deformation of the thermal conditioning element.

In an embodiment the thermal conditioning element is thermally isolated from the remainder of the thermal conditioning unit (for example the stiffening member) and/or the environment. This helps prevent the thermal mass of the remainder of the thermal conditioning unit (e.g. the stiffening member) from adding to the thermal mass of the thermal conditioning element, thereby helping to ensure that the thermal response of the thermal conditioning element remains fast.

An embodiment of the present invention is illustrated in FIG. 11. FIG. 11 illustrates a thermal conditioning unit 100 which may be a temperature stabilization unit. The thermal conditioning unit 100 may be positioned in a lithographic apparatus, in a track of a fab, or in a substrate handler.

The thermal conditioning unit 100 comprises a stiffening member 110, a thermal conditioning element 200 and a support 300. The substrate W is positioned above the thermal conditioning element 200.

The thermal conditioning element 200 has a thickness 205 reduced compared to a typical thermal conditioning element. The reduction in thickness 205 directly results in a lower thermal mass of the thermal conditioning element 200. As a result the temperature stability of the thermal conditioning element 200 is improved; for the same heat transfer rate a lower temperature variation between a sequence of substrates will be present with a thinner thermal conditioning element 200 than for a thicker thermal conditioning element 200 made of the same material (as is shown by comparing FIGS. 9 and 17).

The thermal conditioning element is supported on the stiffening member 110, for example by a support 300. This reduces mechanical deformation of the thermal conditioning element 200 and in particular the flatness of its top surface. Deformation might otherwise occur because of the relative thinness of the thermal conditioning element 200 (in an embodiment it is not self-supporting in that it deforms (e.g. bends) under self-weight). In an embodiment, the support 300 is relatively stiff in the z direction (the vertical direction) compared to in the xy plane in which the support 300 may be relatively compliant. This helps to ensure that the top surface of the thermal conditioning element 200 is flat which is a desirable feature. This is desirable to help ensure uniform heat transfer between the substrate W and the thermal conditioning element 200, in plan and/or to be able to minimize the size of the gap between the thermal conditioning element 200 and the substrate W (because a flat top surface provides more uniform thermal coupling than an uneven surface (i.e. bends) resulting in a non-uniform gap) and so maximize heat transfer between the substrate and the thermal conditioning element 200. The gap between the substrate W and the thermal conditioning element 200 is desirably less than or equal to 50 µm, less than or equal to 25 µm, or less than or equal to 15 µm, for example 10 µm. The gap is desirably small because the film of gas between the substrate and thermal conditioning element 200 is a dominant resistance to heat transfer.

In an embodiment the support 300 is separate from the thermal conditioning element 200 and/or stiffening member 110. In an embodiment the support 300 is part of the thermal conditioning element 200 and/or the stiffening member 110.

In an embodiment as illustrated in FIG. 11, the thermal conditioning element 200 at least partly holds or supports the substrate W. A gas bearing 245 is used to support the substrate W for which purpose gas outlets 240 and inlets 250 are provided in the top surface of the thermal conditioning element 200. The gas inlets and outlets 240, 250 may be connected to passageways that extend all the way through the thickness 205 of the thermal conditioning element 200, so that the gas is provided and extracted from beneath the thermal conditioning element 200. The resulting gas flow past a portion of the underside of the substrate W acts as a gas bearing.

In an embodiment, additional or alternative structure to support the substrate W is provided. In the embodiment of FIG. 11 a substrate position manipulator 350 is provided which contacts the substrate W substantially at its center. The substrate W is partly supported by the substrate position manipulator 350 and partly by the gas bearing 245. The substrate position manipulator 350 extends through a throughhole in the thermal conditioning element 200. The substrate position manipulator 350 can be used to rotate the substrate W and can be used during pre-alignment of the substrate while the substrate W is on the thermal conditioning unit 100. The substrate position manipulator 350 is optional in this and every other embodiment.

In an embodiment the thermal conditioning element 200 is thermally isolated from the stiffening member 110. The thermal isolation may be provided by the support 300 or, as described below, by a lower layer of the thermal conditioning element 200. Thermally isolating the thermal conditioning element 200 from the stiffening member 110 (and/or the remainder of the thermal conditioning unit 100 and/or the surrounding atmosphere) helps ensure that the thermal mass of the stiffening member 110, remainder of the thermal conditioning unit 100 and/or environment is not added to the thermal mass of the thermal conditioning element 200. This results in the thermal response of the thermal conditioning element remaining high.

In the embodiment of FIG. 11 the support 300 comprises a support structure of a plurality of leaf springs 310. The leaf springs 310 contact the thermal conditioning element 200 at a plurality of discrete locations. At least some of the plurality of discrete locations are positioned distant from an edge of the thermal conditioning element 200. This helps ensure that sagging of the thermal conditioning element 200 away from its edge is reduced or minimized. Additionally, the leaf springs 310 thermally insulate or isolate the thermal conditioning element 200 from the remainder of the thermal conditioning unit 100 such as the stiffening member 110, by providing a gap (e.g. filled with gas or a vacuum) between the thermal conditioning element 200 and stiffening member 110. This means that the remainder of the thermal conditioning unit 100 does not add to the thermal mass of the thermal conditioning element 200. That would be undesirable as it would increase the thermal response time of the thermal conditioning element 200. In an embodiment the leaf springs 310 thermally insulate or isolate the thermal conditioning element 200 from the surrounding environment. In an embodiment the leaf springs may comprise a material with a low coefficient of thermal conduction (e.g. stainless steel rather than carbon steel or a polymer) meaning that the thermal conditioning element 200 is also substantially thermally insulated or isolated from the stiffening member 110. The thermal conditioning element 200 may be thermally connected, to some extent, to other parts of the thermal conditioning unit 100, for example by tubing for fluid connected to the thermal conditioning element 200.

In an embodiment the thermal conditioning element 200 comprises a heat transfer component. In an embodiment the heat transfer component comprises at least one channel 230 for the passage therethrough of a heat transfer fluid. In an embodiment the heat transfer fluid is a thermally conditioned fluid. In an embodiment the thermally conditioned fluid may be the same as a thermally conditioned fluid used for cooling one or more lenses of a lithographic apparatus. In an embodiment the thermally conditioned fluid is a liquid, for example water.

In an embodiment, in order to increase the heat transfer coefficient as much as possible, at least two channels 230 are provided in the thermal conditioning element 200. The at least two channels are supplied with heat transfer fluid in parallel. This has an advantage of not only increasing or maximizing the total flow rate of fluid through the thermal conditioning element 200, but also reducing or minimizing the pressure drop of thermal conditioning fluid as it flows through the thermal conditioning element 200 and of reducing or minimizing the change in temperature of the heat transfer fluid as it flows through the thermal conditioning element 200.

In an embodiment the at least one channel 230 may form part of a phase change fluid heat transfer system. In such a system the heat transfer fluid is chosen such that it changes phase at a desired set point temperature and is therefore capable of transferring heat much more efficiently than a heat transfer fluid which does not change phase.

In an embodiment the channel 230 is part of a heat pipe. In a heat pipe at one end of the channel the heat transfer fluid is a liquid and at the other end of the channel the heat transfer fluid is a mixture of gas and liquid. Changing from a gas to a fluid, and vice versa, absorbs and lets out heat and so this is an efficient way of transferring heat between one end of the channel and the other. For this purpose a heat exchanger may be provided connected to the channel 230, optionally at a location distant from the thermal conditioning element 200. In case of two parallel channels, a restriction can be placed upstream of the inlet of the individual channels to level the operational pressures of the liquid/gas mixtures inside the parallel channels, in order to level the temperature levels in both parallel channels.

In an embodiment the thermal conditioning element 200 is comprised of a single layer.

In an embodiment the thermal conditioning element 200 is comprised of an upper layer 210 and a lower layer 220 between which the heat transfer component is positioned. The upper and lower layers 210, 220 may be plates.

In an embodiment the upper layer 210 is formed of a material with a high thermal conductivity and a low heat capacity. This helps ensure that heat is transferred quickly between the thermal conditioning element 200 and the substrate W without much of the heat being absorbed by the thermal conditioning element 200 itself. In an embodiment the upper layer 210 is made of a material with a heat capacity below about 3.0 Jcm$^{-3}$ K$^{-1}$ and a thermal conductivity above about 100 W/mK. An example material is aluminum which has a thermal conductivity at 25° C. of 250 W/mK and a heat capacity of 2.4 Jcm$^{-3}$ K$^{-1}$. In an embodiment the upper layer is made of magnesium which has a thermal conductivity of 156 W/mK and a heat capacity of 1.77 Jcm$^{-3}$ K$^{-1}$. Other materials may be suitable, particularly a ceramic. Other examples include SiSiC which has a thermal conductivity 185 of W/mK and a heat capacity of 2.0 Jcm$^{-3}$ K$^{-1}$ and (encapsulated) thermal pyrolytic graphite with a thermal conductivity of 1500 W/mK and a heat capacity of 1.6 Jcm$^{-3}$ K$^{-1}$.

In an embodiment the thickness of the upper layer 210 is less than or equal to 5 mm, less than or equal to 4 mm, less than or equal to 3 mm, less than or equal to 2 mm, less than or equal to 1.5 mm or less than or equal to 1 mm. In an embodiment the thickness of the upper layer is 1 mm. As described below with reference to FIGS. 14-17, this also advantageously reduces the heat capacity of the thermal conditioning element 200, at the expense of stiffness. However, the reduction in stiffness is compensated by providing the stiffening member 110.

In an embodiment the total thickness of the thermal conditioning element 200 is less than or equal to 11 mm, less than or equal to 10 mm, less than or equal to 5 mm, or less than or equal to 3 mm.

In an embodiment the thickness of the lower layer 220 is less than or equal to 5 mm, less than or equal to 4 mm, less than or equal to 3 mm, less than or equal to 2 mm, less than or equal to 1.5 mm or less than or equal to 1 mm. In an embodiment the thickness of the lower layer is 1 mm.

The lower layer 220 desirably has a low heat capacity. However, the thermal conductivity of the lower layer 220 is less important than that of the upper layer 210. This is because the lower layer 220 does not provide for heat transfer between the substrate W and the thermal conditioning element 200. Indeed, it may be advantageous that the thermal conductivity of the lower layer 220 is particularly low, for example below about 50 W/mK, in order that heat does not transfer from the thermal conditioning element 200 to the support 300 and/or stiffening member 110. Leaking of heat into the support 300 or stiffening member 110 would be disadvantageous as the thermal mass of those components might result in the accumulation of heat illustrated in FIG. 9.

In an embodiment the lower layer 220 is made of aluminum, ceramic or magnesium. In an embodiment the lower layer 220 is made of a highly porous solid such as an aerogel. An aerogel is a solid (made from a gel) with an extremely low density and thermal conductivity (because it is mainly air). Other examples include Zerodur™ which is a glass ceramic (a lithium aluminosilicate glass ceramic) with a thermal conductivity of 1.4 W/mK and a heat capacity 2.0 Jcm$^{-3}$ K$^{-1}$ or stainless steel with a thermal conductivity of 15 W/mK and a heat capacity 4.0 Jcm$^{-3}$ K$^{-1}$.

In an embodiment, the support 300 and/or stiffening member 110 is part of the thermal conditioning element 200. In an embodiment the lower layer 220 is configured as the support 300 and/or stiffening member 110. That is, the lower layer 200 is made stiff enough such that it reduces mechanical deformation of the upper layer 210. In an embodiment a separate stiffening member 110 is not necessary. In an embodiment the lower layer 220 is made of a material with a low thermal conductivity and high stiffness. Desirably the lower layer 220 is made of a material with a low heat capacity such as an aerogel.

In an embodiment the support 300 may be an additional layer of the thermal conditioning element 200 (a layer between the lower layer 220 and the stiffening member 110). In an additional or alternative embodiment the additional layer is a layer of the stiffening member 110. In an additional or alternative embodiment the additional layer is physically in contact with the lower layer 220 of the thermal conditioning element 200 and a top surface of the stiffening member 110. In an embodiment the additional layer is desirably a material with a low thermal conductivity and/or low heat capacity and/or high stiffness.

In an embodiment the upper layer 210 and lower layer 220 are made of different materials. The upper layer 210 comprises a material with a low heat capacity and a high thermal conductivity whereas the material of the lower layer 220 is a material with a low heat capacity and optionally with a low thermal conductivity, for instance below about 50 W/mK. The upper and lower layers 210, 220 can be joined in any way including, but not limited to gluing, welding, brazing, or soldering (including glass frit bonding).

In an embodiment the upper and/or lower layer has a heat capacity of less than or equal to 2.0 Jcm$^{-3}$ K$^{-1}$ or less than or equal to 1.5 Jcm$^{-3}$ K$^{-1}$.

In an embodiment the stiffening member 110 is made of a material such as aluminum, steel, ceramic, glass ceramic or another material with a high stiffness. In an embodiment the stiffening member 110 is a unitary body which may or may not be machined or formed with cavities and/or projections in it. In an embodiment the stiffening member 110 may comprise a plurality of components glued, welded, brazed, bolted or otherwise bonded or held together.

In an embodiment the distance between the bottom of the thermal conditioning element 200 and the top of the stiffening member 110 is greater than the distance between the top of the thermal conditioning element 200 and the bottom of the substrate W. This is advantageous because this results in better heat transfer between the substrate W and the thermal conditioning element 200 compared to between the thermal conditioning element 200 and the stiffening member 110.

FIG. 12 illustrates an embodiment which is the same as that of FIG. 11 except as described below. In the FIG. 12 embodiment the way that the thermal conditioning element 200 at least partly holds or supports the substrate W is different to that in FIG. 11 and the way in which the support 300 supports the thermal conditioning element 200 is different to that in FIG. 11. In an embodiment instead of comprising the support 300 of FIG. 12, the support of FIG. 11 may be used. In an embodiment instead of comprising the projections 260 described below, the embodiment of FIG. 12 may comprise the gas bearing 245 of FIG. 11.

In FIG. 12 the thermal conditioning element 200 comprises one or more projections 260. The projection 260 (sometimes called a burl) has a relatively small total surface area but supports the substrate W on its underside in a plurality of locations. In an embodiment an under pressure may be provided between the projection 260 and the thermal conditioning element 200 and the substrate W. This would be effective to clamp the substrate W to the projection 260. The projection 260 may be similar to the well known one or more projections used on a substrate table in a lithographic apparatus. The advantage of using a projection 260 is that the heat transfer between the thermal conditioning element 200 and substrate W is improved by the direct contact and resulting thermal conduction through the material of the upper layer 210 of the thermal conditioning element 200. In an embodiment a gas is provided (e.g. at an under pressure) to a region between the substrate W and thermal conditioning element 200, wherein the gas has a thermal conductivity greater than or equal to 100 mW/m·K at 298K. One such gas is $H_2$. Such a system is described in U.S. Ser. No. 13/569,926 filed on Aug. 8, 2012, U.S. 61/521,952 filed on Aug. 10, 2011 and U.S. 61/544,875 filed on Oct. 7, 2011, each of which is hereby incorporated in its entirety by reference.

In the embodiment of FIG. 12, the thermal conditioning element 200 is supported on the stiffening member 110 by a gas bearing 320. The gas bearing 320 reduces mechanical deformation of the thermal conditioning element 200, particularly in the z direction.

In an embodiment a temperature sensor 375 is provided in the channel 230 for heat transfer liquid. The signal from the temperature sensor 375 can be used in a feedback manner such as in the way described in U.S. Ser. No. 13/183,220 filed on Jul. 14, 2011, hereby incorporated in its entirety by reference. The temperature sensor 375 may be provided at the exit of a channel 230 (in which case the temperature measured is an integral of the temperature along the length of the channel 230 and the response time is slow since liquid which is cooled by cold spots of the substrate has to travel a long distance along the channel) or a plurality of temperature sensors 375 may be provided along the length of the channel 230. In an embodiment the temperature sensor(s) 375 is/are alternatively or additionally arranged in the thermal conditioning element 200.

In an embodiment, the thermal conditioning unit 100 of FIG. 12 does not have a substrate position manipulator 350 and a separate pre-aligning unit is provided.

Figure 13:
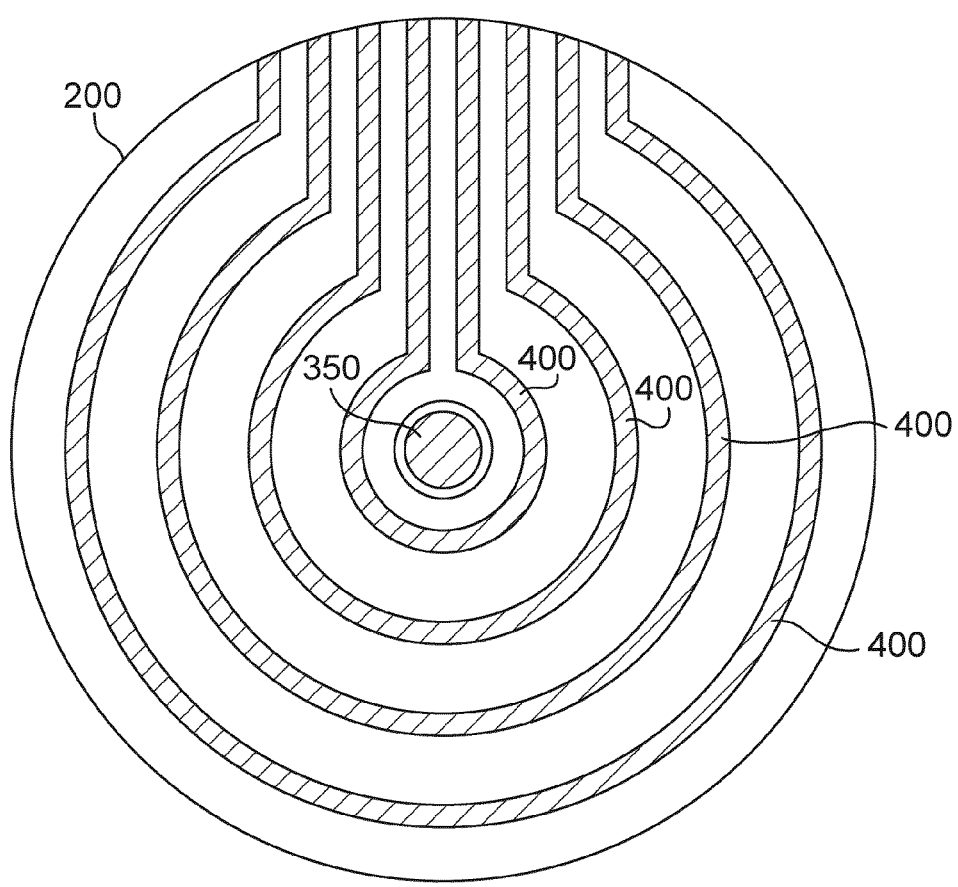
FIG. 13 illustrates, in plan, a thermal conditioning unit according to an embodiment of the present invention.

FIG. 13 illustrates an embodiment in which at least one heat transfer element (e.g. heater) 400 is provided on or in the thermal conditioning element 200. The heat transfer element 400 may have any shape. In one embodiment the heat transfer element is an annular ring. In an embodiment a plurality of heat transfer elements 400 are provided. In an embodiment a plurality of heat transfer elements 400 are in the form of annular rings around the central axis of the thermal conditioning element 200. The heat transfer elements 400 may be on the surface of the upper layer 210. In an embodiment the heat transfer elements 400 are in the form of a thin film on the outer surface of the upper layer 210. The heat transfer element 400 may be such as described in United States patent application publication no. US 2011-0222033, which is hereby incorporated in its entirety by reference, described in relation to use on a substrate table. The control of the heat transfer element 400 may be similar to that described in US 2011-0222033. In an embodiment the heat transfer element 400 is embedded within the thermal conditioning element 200.

If the substrate W is rotated by the substrate position manipulator 350, a cold spot, for example, on the substrate W will be better conditioned if the heat transfer element 400 is arranged radially as illustrated in FIG. 13. The signal from the temperature sensor(s) 375 in the channel 230/thermal conditioning element 200 may be used in a feedback manner to control the temperature of the heat transfer element 400. For this purpose a controller 500 may be used. In an embodiment, the top surface of the substrate position manipulator 350 has a heat transfer element and a temperature sensor and the heat transfer element is controlled by the controller 500, for example in a feedback manner based on the signal of the temperature sensor. In an embodiment, the thermal conditioning element 200 has at least one heat transfer element 400 and no channel 230.

An advantage of using a heat transfer element 400 is that a heat transfer element may respond more rapidly to a temperature change than the thermal conditioning system based upon flow of heat transfer fluid in the channel 230. The provision of a heat transfer element 400 therefore addresses a potential disadvantage of the thermal conditioning system based upon flow of heat transfer fluid along a channel 230 which is that the response time of such a system is slow as liquid which is, for example, cooled by a cold spot on the substrate W has to travel a long distance along the channel 230 before it can be re-heated.

Figure 14:
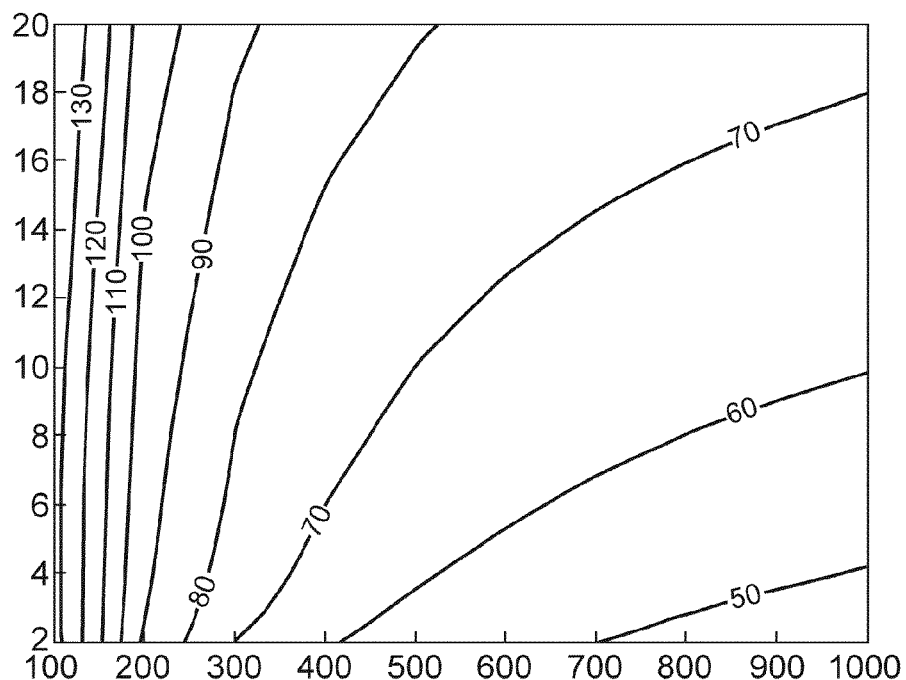
FIG. 14 is a graph of thickness of an aluminum thermal conditioning element on the y axis versus heat transfer coefficient to water along the x axis with the different lines representing different temperature levels of the substrate after a certain waiting time on the thermal conditioning element when loaded with an initial offset.
Figure 15:
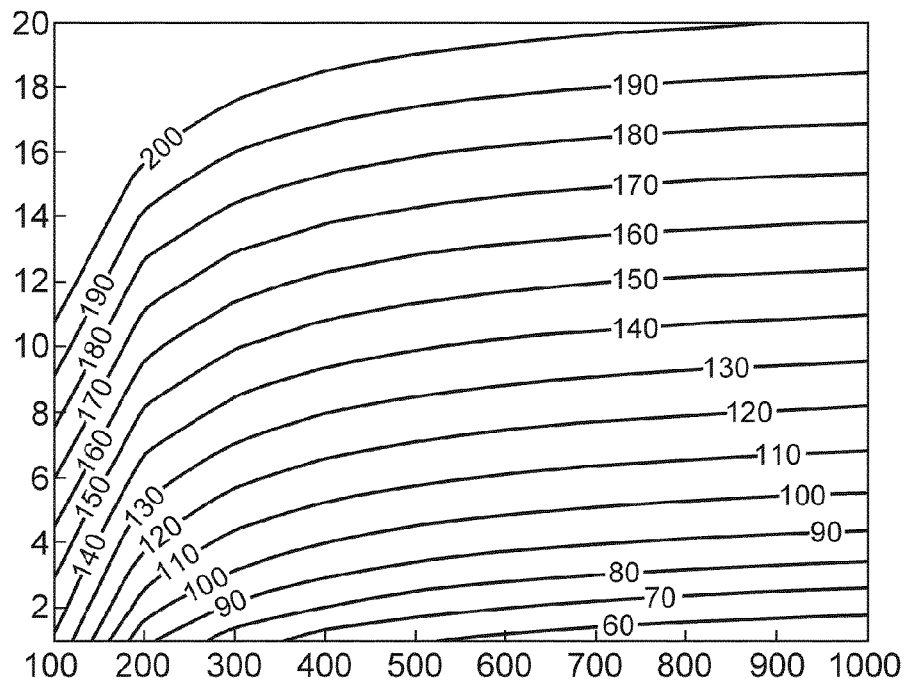
FIG. 15 is the same as FIG. 14 except for a stainless steel rather than aluminum thermal conditioning element.

FIGS. 14 and 15 illustrate how the thickness of the thermal conditioning element 200, and material of the thermal conditioning element 200 affect the achievable temperature variation of a substrate W placed on the thermal conditioning element 200 in six seconds. FIG. 14 illustrates the example for an aluminum thermal conditioning element 200 (which has a thermal conductivity of 250 W/mK and a heat capacity of 2.4 $Jcm^{-3}$ $K^{-1}$) whereas FIG. 15 illustrates the same results for stainless steel (which has a thermal conductivity of 16 W/mK and heat capacity of 3.5 $Jcm^{-3}$ $K^{-1}$). The x axis is an assumed heat transfer coefficient to heat transfer fluid in the channels 230 and the y axis is the total thickness 205 of the thermal conditioning element 200. The lines plotted are the temperatures of the substrates in mK from a desired temperature after six seconds on the thermal conditioning unit 100 with the temperature off-set of the substrate at zero seconds being 1000 mK. As can be seen, the FIG. 14 embodiment is significantly more effective at reducing the temperature of the substrate towards the target temperature than the stainless steel embodiment illustrated in FIG. 15. This is a result of the lower heat capacity of aluminum compared to stainless steel. Clearly the lower the thickness of the thermal conditioning element 200 and the higher the heat transfer coefficient the faster the set point temperature will be reached.

Figure 16:
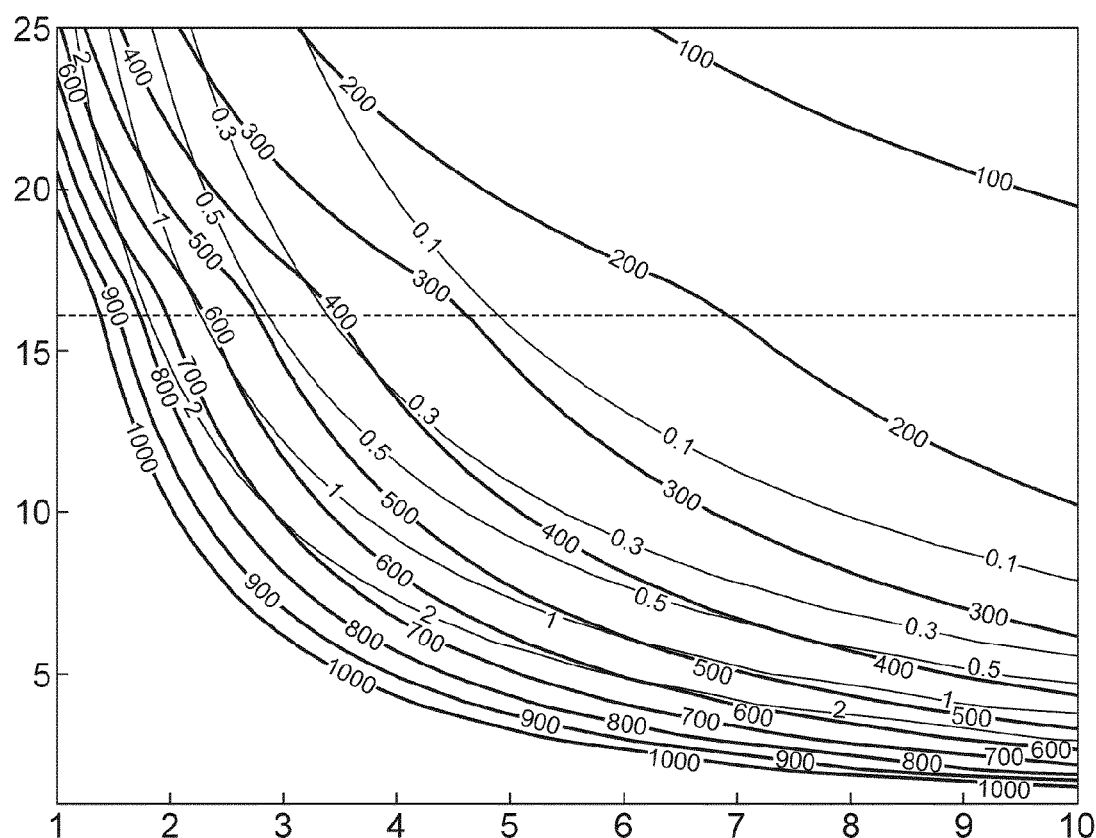
FIG. 16 is a graph of the width of a cooling channel on the y axis versus the height of a cooling channel on the x axis for a spiral channel in an aluminum thermal conditioning element with the different lines representing different constant heat transfer coefficients or pressure drops.

FIG. 16 illustrates the results of a simulation for a thermal conditioning element 200 with a spiral channel formed in it with the height of the channel along the x axis and the width of the channel along the y axis. The lines with the larger numbers are the calculated heat transfer coefficient achieved and the lines with the smaller numbers are the calculated pressure drop. For example for a pressure drop of just over 0.5 Bar (say 0.55 Bar, by interpolation), a heat transfer coefficient of 500 W/mK may be achieved using a spiral channel of 3 mm height and 16 mm width. In an embodiment a channel of those dimensions is used. The total thickness 205 of the thermal conditioning element 200 is 5 mm with a top layer of 1 mm, a lower layer of 1 mm and a heat transfer component (e.g. channels 230) of 3 mm.

The results in FIG. 17 are based on an embodiment with upper and lower layers of aluminum of 3 mm thickness and a heat transfer component 230 transferring 700 $W/m^2K$ to the substrate (the same conditions as for the FIG. 9 calculations except that the thickness of the upper and lower aluminum layers is reduced). As can be seen, although there is a temperature difference of 3 mK between the first and second substrates, the subsequent substrates all leave the thermal conditioning unit at substantially the same thermal off-set. Thus, FIG. 17 shows the improvement obtainable by using a thermal conditioning element which is thinner and which is supported on a stiffening member 110 to reduce mechanical deformation of the thermal conditioning element 200. The stiffening member 110 is thermally insulated from the thermal conditioning element 200 to help ensure that the stiffening member 110 does not contribute to the thermal mass of the thermal conditioning element 200.

In an embodiment, there is provided a thermal conditioning unit to thermally condition a substrate in a lithographic apparatus, the thermal conditioning unit comprising: a thermal conditioning element comprising a first layer, in use, facing the substrate and comprising a material having a thermal conductivity of 100 W/mK or more, a second layer and a heat transfer component positioned between the first and second layers; and a stiffening member which is stiffer than the thermal conditioning element and configured to support the thermal conditioning element so as to reduce mechanical deformation thereof, wherein the thermal conditioning element is thermally isolated from the stiffening member.

In an embodiment, the thermal conditioning element is thermally isolated from the surrounding environment. In an embodiment, the thermal conditioning element comprises a heat transfer component. In an embodiment, the heat transfer component comprises a channel for the passage therethrough of a heat transfer fluid. In an embodiment, the heat transfer fluid is a thermally conditioned fluid. In an embodiment, the heat transfer fluid is a phase change fluid of a phase change heat transfer system. In an embodiment, the channel is part of a heat pipe. In an embodiment, the thermal conditioning unit comprises a further channel, the channel and the further channel configured to be supplied with heat transfer fluid in parallel. In an embodiment, the first layer is made of at least one material selected from aluminum, ceramic, magnesium, SiSiC, or pyrolytic graphite. In an embodiment, the first layer is made of a material with a heat capacity below about 3.0 Jcm$^{-3}$ K$^{-1}$. In an embodiment, the first layer has a thickness of 5 mm or less, 4 mm or less, 3 mm or less, 2 mm or less, 1.5 mm or less, or 1 mm or less. In an embodiment, the second layer is made of at least one material selected from aluminum, ceramic, magnesium, aerogel, a glass ceramic, or stainless steel. In an embodiment, the second layer is made of a material with a heat capacity of below about 3.0 Jcm$^{-3}$ K$^{-1}$. In an embodiment, the second layer is made of a material with a heat capacity of below about 2.0 Jcm$^{-3}$ K$^{-1}$ or below about 1.5 Jcm$^{-3}$ K$^{-1}$. In an embodiment, the second layer has a thickness of 5 mm or less, 4 mm or less, 3 mm or less, 2 mm or less, 1.5 mm or less, or 1 mm or less. In an embodiment, the first layer and second layer are made of different materials. In an embodiment, the material of the first layer has a lower heat capacity and/or a higher thermal conductivity than the material of the second layer. In an embodiment, the second layer is configured to support the thermal conditioning element on the stiffening member. In an embodiment, the thermal conditioning element comprises a projection for the positioning thereon of the substrate. In an embodiment, the thermal conditioning element comprises a plurality of outlets and/or inlets therethrough to provide a gas flow past a portion of an underside of the substrate as a gas bearing so as to at least partly support the substrate on the thermal conditioning element. In an embodiment, the thermal conditioning unit further comprises a substrate position manipulator configured to alter the relative position and/or orientation of the substrate to the thermal conditioning element. In an embodiment, a part of the substrate positioning manipulator extends through the thermal conditioning element. In an embodiment, the thermal conditioning unit further comprises a support structure to support the thermal conditioning element on the stiffening member and which contacts the thermal conditioning element at a plurality of discrete locations. In an embodiment, at least one of the plurality of discrete locations is distant from an edge of the thermal conditioning element. In an embodiment, the thermal conditioning unit comprises a plurality of leaf springs to support the thermal conditioning element on the stiffening member. In an embodiment, the thermal conditioning unit further comprises a gas bearing configured to support the thermal conditioning element on the stiffening member. In an embodiment, the thermal conditioning unit further comprises a heater associated with the thermal conditioning element. In an embodiment, the heater is a thin film heater. In an embodiment, the thin film heater is on an outer surface of the thermally conditioning element facing the substrate.

In an embodiment, there is provided a lithographic apparatus comprising the thermal conditioning unit as described herein.

In an embodiment, there is provided a device manufacturing method using a lithographic apparatus, the method comprising: thermally conditioning a substrate by placing it over a thermal conditioning element comprising a first layer, facing the substrate, comprising a material having a thermal conductivity of 100 W/mK or more, a second layer and a heat transfer component positioned between the first and second layers, the thermal conditioning element being supported by a stiffening member to reduce mechanical deformation of the thermal conditioning element; and projecting a patterned beam onto the substrate, wherein the thermal conditioning element is thermally isolated from the stiffening member.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing and sending signals. One or more multiple processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine readable instructions of one or more computer programs.

An embodiment of the invention may be applied to substrates with a width (e.g., diameter) of 300 mm or 450 mm or any other size.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A thermal conditioning unit to thermally condition a substrate, the thermal conditioning unit comprising:
   a thermal conditioning element comprising a first layer, in use, facing the substrate and comprising a material having a thermal conductivity of 100 W/mK or more, a second layer and a heat transfer component, configured to actively create heat transfer, positioned between the first and second layers; and
   a stiffening member which is stiffer than the thermal conditioning element and configured to support the thermal conditioning element by at least the second layer so as to reduce mechanical deformation of the thermal conditioning element, wherein a stiffness of the support of the thermal conditioning element is greater in a direction perpendicular to a direction of elongation of the second layer than in a direction parallel to the direction of elongation of the second layer,
   wherein the thermal conditioning element is thermally isolated from the stiffening member.

2. The thermal conditioning unit of claim 1, wherein the heat transfer component comprises a channel for the passage therethrough of a heat transfer fluid.

3. The thermal conditioning unit of claim 2, wherein the heat transfer fluid is a phase change fluid of a phase change heat transfer system.

4. The thermal conditioning unit of claim 2, wherein the thermal conditioning unit comprises a further channel, the channel and the further channel configured to be supplied with heat transfer fluid in parallel.

5. The thermal conditioning unit of claim 1, wherein the first layer is made of at least one selected from: aluminum, ceramic, magnesium, SiSiC, or pyrolytic graphite.

6. The thermal conditioning unit of claim 1, wherein the first layer and/or the second layer is made of a material with a heat capacity below about 3.0 Jcm$^{-3}$ K$^{-1}$.

7. The thermal conditioning unit of claim 1, wherein the first layer has a thickness of 5 mm or less.

8. The thermal conditioning unit of claim 1, wherein the second layer is made of at least one selected from: aluminum, ceramic, magnesium, aerogel, a glass ceramic, or stainless steel.

9. The thermal conditioning unit of claim 1, wherein the second layer has a thickness of 5 mm or less.

10. The thermal conditioning unit of claim 1, wherein the first layer and second layer are made of different materials.

11. The thermal conditioning unit of claim 1, wherein the material of the first layer has a lower heat capacity and/or a higher thermal conductivity than the material of the second layer.

12. The thermal conditioning unit of claim 1, wherein the second layer is configured to support the thermal conditioning element on the stiffening member by physical contact with the stiffening member.

13. The thermal conditioning unit of claim 1, wherein the thermal conditioning element comprises a plurality of outlets and/or inlets therethrough to provide a gas flow past a portion of an underside of the substrate as a gas bearing so as to at least partly support the substrate on the thermal conditioning element.

14. The thermal conditioning unit of claim 1, further comprising a substrate position manipulator configured to alter the relative position and/or orientation of the substrate to the thermal conditioning element.

15. The thermal conditioning unit of claim 1, further comprising a support structure to support the thermal conditioning element on the stiffening member and which contacts the thermal conditioning element at a plurality of discrete locations.

16. The thermal conditioning unit of claim 15, further comprising a plurality of leaf springs to support the thermal conditioning element on the stiffening member.

17. The thermal conditioning unit of claim 1, further comprising a gas bearing configured to support the thermal conditioning element on the stiffening member.

18. The thermal conditioning unit of claim 1, further comprising a heater associated with the thermal conditioning element.

19. A lithographic apparatus comprising:
  a projection system configured to project a beam of radiation onto a substrate;
  a thermal conditioning unit to thermally condition the substrate, the thermal conditioning unit comprising:
    a thermal conditioning element comprising a first layer, in use, facing the substrate and comprising a material having a thermal conductivity of 100 W/mK or more, a second layer and a heat transfer component, configured to actively create heat transfer, positioned between the first and second layers; and
    a stiffening member which is stiffer than the thermal conditioning element and configured to support the thermal conditioning element by at least the second layer so as to reduce mechanical deformation of the thermal conditioning element, wherein a stiffness of the support of the thermal conditioning element is greater in a direction perpendicular to a direction of elongation of the second layer than in a direction parallel to the direction of elongation of the second layer,
    wherein the thermal conditioning element is thermally isolated from the stiffening member.

20. A device manufacturing method using a lithographic apparatus, the method comprising:
  thermally conditioning a substrate by placing it over a thermal conditioning element comprising a first layer, facing the substrate, comprising a material having a thermal conductivity of 100 W/mK or more, a second layer and a heat transfer component, actively creating heat transfer, positioned between the first and second layers, a stiffening member supporting the thermal conditioning element by at least the second layer to reduce mechanical deformation of the thermal conditioning element, wherein a stiffness of the support of the thermal conditioning element is greater in a direction perpendicular to a direction of elongation of the second layer than in a direction parallel to the direction of elongation of the second layer; and
  projecting a patterned beam onto the substrate,
  wherein the thermal conditioning element is thermally isolated from the stiffening member.

* * * * *